United States Patent [19]

Obayashi

[11] Patent Number: 4,801,898
[45] Date of Patent: Jan. 31, 1989

[54] VOLTAGE-CONTROLLED OSCILLATOR

[75] Inventor: Katsuki Obayashi, Kodaira, Japan

[73] Assignee: Hitachi Denshi Kabushiki Kaisha, Tokyo, Japan

[21] Appl. No.: 169,565

[22] Filed: Mar. 17, 1988

[51] Int. Cl.$^4$ .................. H03B 7/00; H03B 7/06; H03C 3/20

[52] U.S. Cl. .................. 331/132; 331/177 V; 332/30 V

[58] Field of Search ...... 331/107 R, 107 DP, 107 SL, 331/107 C, 107 G, 107 T, 115, 116 R, 116 FE, 117 R, 117 FE, 117 D, 132, 177 V; 332/30 V

[56] References Cited

U.S. PATENT DOCUMENTS 4,503,402 3/1985 Englund, Jr. .................. 331/36 C
4,684,904 8/1987 Watkins et al. .............. 331/177 VX Primary Examiner—Eugene R. LaRoche
Assistant Examiner—David Mis
Attorney, Agent, or Firm—Townsend and Townsend

[57] ABSTRACT

A voltage-controlled oscillator includes a negative resistance generator, a resonant circuit, a first series circuit, a second series circuit, and a third series circuit. The first series circuit controls an oscillation frequency for changing a resonant frequency of the resonant circuit, and the second series circuit modulates this frequency. The third series circuit consists of a capacitor and a variable capacitance diode to which the modulation signal is supplied. The third series circuit changes the resonant frequency of the resonant circuit in a direction for cancelling a change in modulation sensitivity caused by the second series circuit.

33 Claims, 5 Drawing Sheets

VOLTAGE-CONTROLLED OSCILLATOR

BACKGROUND OF THE INVENTION

The present invention relates to a voltage-controlled oscillator which can perform frequency modulation.

A voltage-controlled oscillator (to be referred to as a VCO hereinafter) is used for reference frequency oscillation of various electronic circuits. When the VCO is used for reference frequency oscillation of a radio transmitter/receiver, an oscillation center frequency must be controlled by a control voltage and an oscillation frequency must be deviated by a modulation signal, thereby performing frequency modulation (to be referred to as FM hereinafter). In this case, an arrangement shown in FIG. 9 is generally used.

That is, a resonant circuit 2 consisting of an inductance coil and a capacitor is excited by a negative resistance generator 1 consisting of active elements, thereby oscillating a frequency determined by a resonant frequency of the resonant circuit 2. A first series circuit consisting of a first capacitor Cc and a first variable capacitance diode (to be referred to as a VCD hereinafter) Dv and a second series circuit consisting of a second capacitor Cs and a second VCD·Df are connected in parallel with the resonant circuit 2. A control voltage Vc is applied from a terminal 3 to the VCD·Dv to change the resonant frequency of the resonant circuit 2, and a modulation signal Vm is supplied from a terminal 4 to the VCD·Df to change the resonant frequency of the resonant circuit 2. That is, the oscillation frequency is controlled by the control voltage Vc, and FM is performed by the modulation signal Vm.

FIGS. 10(A) and 10(B) show equivalent circuits of FIG. 9, in which FIG. 10(A) shows elements for determining the oscillation frequency and FIG. 10(B) shows a synthetic state of the elements. Assuming that a capacitance of the VCD·Df is Cf, that an invariable component corresponding to a DC component of the modulation signal Vm is $C_0$, and that a variable component corresponding to an AC component of the signal Vm is $\Delta C$, $Cf = C_0 + \Delta C$. Assuming that a capacitance of the VC·Dv is Cv, that an inductance and a capacitance which constitute the resonant circuit 2 are L and C, respectively, and that a synthetic capacitance connected to both ends of the inductance L is Ct, Ct is given by the following equation:

$$Ct = C + \frac{Cc \cdot Cv}{Cc + Cv} + \frac{Cs \cdot Cf}{Cs + Cf} \qquad (1)$$

$$= \frac{Cp(Cs + C_0) + Cs \cdot C_0}{Cs + C_0} \cdot \frac{1 + a \cdot \Delta C}{1 + b \cdot \Delta C}$$

for $\quad Cp = C + \frac{Cc \cdot Cv}{Cc + Cv}$ $\quad a = \frac{Cp + Cs}{Cp(Cs + C_0) + Cs \cdot C_0}$ $\quad b = \frac{1}{Cs + C_0}$ Assuming that oscillation frequency for $\Delta C=0$ is $f_0$, oscillation frequency f determined by the above equations is represented by the following equation:

$$f = \frac{1}{2\pi \sqrt{L \cdot Ct}} = f_0 \left( \frac{1 + a \cdot \Delta C}{1 + b \cdot \Delta C} \right)^{-\frac{1}{2}} \qquad (2)$$

where $$f_0 = \frac{1}{2\pi \sqrt{L}} \left( \frac{Cp(Cs + C_0) + Cs \cdot C_0}{Cs + C_0} \right)^{-\frac{1}{2}} \qquad (3)$$

Since equation (2) is a function of $\Delta C$, this equation is subjected to Taylor expansion to obtain the following equation:

$$f + f_0 - \frac{1}{2}(a - b)f_0 \cdot \Delta C + \ldots$$

Assuming that $f = f_0 + \Delta f$, frequency deviation $\Delta f$ is represented by the following equation:

$$\Delta f = f_0 - \{\tfrac{1}{2}(a - b)\Delta C + \ldots\} \qquad (4)$$

The characteristic of the VCD·Df is $Cf = K \cdot V^{-r}$ as is well known. Assume that an invariable component of the modulation signal Vm is $V_0$, that a variable component thereof is $\Delta V$, and that $Vm = V_0 + \Delta V$. In this case, since $Cf = C_0 + \Delta C$, the following equation is obtained:

$$C_0 + \Delta C = K(V_0 + \Delta V)^{-r}$$

$$= K \cdot V_0^{-r} \left( 1 - \frac{r}{V_0} \Delta V + \ldots \right)$$

In this case, since $C_0$ is a capacitance obtained when $\Delta V = 0$, $C_0 = K \cdot V_0^{-r}$ is obtained. Therefore, the following equation is obtained:

$$\Delta C = C_0 \left( \frac{r}{V_0} \Delta V + \ldots \right) \qquad (5)$$

A substitution of equation (5) into equation (4) yields frequency deviation $\Delta f$ near only $V_0$ as follows:

$$\Delta f = f_0 \tfrac{1}{2}(a - b) C_0 \frac{r}{V_0} \Delta V$$

Therefore, modulation sensitivity S is represented as the following equation:

$$S = \frac{\Delta f}{\Delta V} = \frac{f_0 \cdot r}{2V_0} C_0(a - b) \qquad (6)$$

When a and b of equation (1) are substituted into equation (6), the following equation is obtained:

$$S = \frac{r \cdot C_0 \cdot Cs^2}{2V_0\{Cp + (C_0 + Cs) + Cs \cdot C_0\}(C_0 + Cs)} f_0 \qquad (7)$$

When a relationship between Cp and $f_0$ obtained from equation (3) is substituted into equation (7), the following equation is obtained:

$$S = \frac{r \cdot \pi^2 \cdot L \cdot C_0 \cdot Cs^2}{V_0(C_0 + Cs)^2} f_0^3 \qquad (8)$$

Therefore, the modulation sensitivity S is increased in proportion to the third power of the center oscillation frequency $f_0$.

However, when the oscillation frequency $f_0$ is used as a reference of a carrier frequency, the modulation frequency varies in accordance with it. Therefore, if a conventional VCO is used, modulation sensitivities of channels having different frequencies are, not undesirably, uniform.

SUMMARY OF THE INVENTION

It is, therefore, an object of the present invention to provide a VCO in which modulation sensitivities of channels are uniform.

According to a first aspect of the present invention, there is provided a voltage-controlled oscillator comprising a negative resistance generator, a resonant circuit excited by the negative resistance generator and including an inductance, a first series circuit, consisting of a first capacitor and a first variable capacitance diode to which a control voltage is applied, for controlling an oscillation frequency for changing a resonant frequency of the resonant circuit, a second series circuit, consisting of a second capacitor and a second variable capacitance diode to which a modulation signal is supplied, for modulating a frequency for changing the resonant frequency of the resonant circuit, and a third series circuit, consisting of a third capacitor and a third variable capacitance diode to which the modulation signal is supplied, for changing the resonant frequency of the resonant circuit in a direction for canceling a change in modulation sensitivity caused by the second series circuit.

According to a second aspect of the present invention, there is provided a voltage-controlled oscillator comprising a negative resistance generator, a resonant circuit excited by the negative resistance generator and including an inductance, a first series circuit, consisting of a first capacitor and a first variable capacitance diode to which a control voltage is applied, for controlling an oscillation frequency for changing a resonant frequency of the resonant circuit, a second series circuit, consisting of a second capacitor and a second variable capacitance diode to which a modulation signal is supplied, for modulating a frequency for changing the resonant frequency of the resonant circuit, a third series circuit, consisting of a third capacitor and a third variable capacitance diode to which the modulation signal is supplied, for changing the resonant frequency of the resonant circuit in a direction for canceling a change in modulation sensitivity caused by the second series circuit, a bias circuit for applying a DC bias voltage to the second and third variable diodes, and variable voltage dividers each inserted in a corresponding one of paths for supplying modulation signals to the second and third variable capacitance diodes.

According to a third aspect of the present invention, there is provided a voltage-controlled oscillator comprising a negative resistance generator, a resonant circuit excited by the negative resistance generator and including an inductance, a first series circuit, consisting of a first capacitor and a first variable capacitance diode to which a control voltage is applied, for controlling an oscillation frequency for changing a resonant frequency of the resonant circuit, a second series circuit, consisting of a second capacitor and a second variable capacitance diode to which a modulation signal is supplied, for modulating a frequency for changing the resonant frequency of the resonant circuit, a third series circuit, consisting of a third capacitor and a third variable capacitance diode to which the modulation signal is supplied, for changing the resonant frequency of the resonant circuit in a direction for canceling a change in modulation sensitivity caused by the second series circuit, and a superposing circuit for superposing and supplying the modulation signal and the control voltage to the second and third variable capacitance diodes.

DETAILED DESCRIPTION OF THE PREFERRED EMBODIMENTS

The present invention will be described in detail below with reference to the accompanying drawings.

Figure 1:
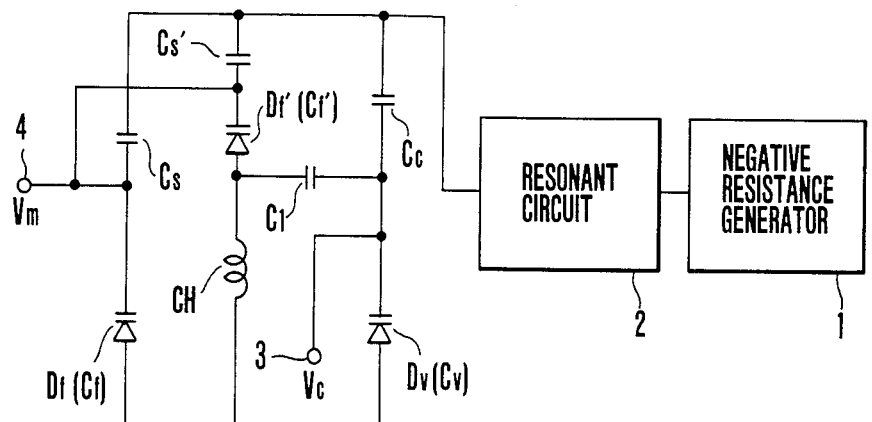
FIG. 1 is a circuit diagram of a voltage-controlled oscillator (VCO) according to an embodiment of the present invention.

FIG. 1 is a circuit diagram of an embodiment of the present invention. In FIG. 1, a first series circuit consisting of a first capacitor Cc and a first VCD·Dv and a second series circuit consisting of a second capacitor Cs and a second VC·Df are connected to a resonant circuit 2 which is excited by a negative resistance generator 1 consisting of active elements. A control voltage Vc is applied from a terminal 3 to the VCD·Dv, and a modulation signal Vm is supplied from a terminal 4 to the VCD·Df, thereby controlling the oscillation frequency and performing FM as in FIG. 9. A third series circuit consisting of a third capacitor Cs' and a third VCD·Df' is connected in parallel with the capacitor Cc through a capacitor $C_1$ for blocking a DC voltage. The anode of the VCD·Df' is connected to a common circuit through a high-frequency choke coil CH. The modulation signal Vm from the terminal 4 is also supplied to the cathode of the VCD·Df'.

Figure 2A:
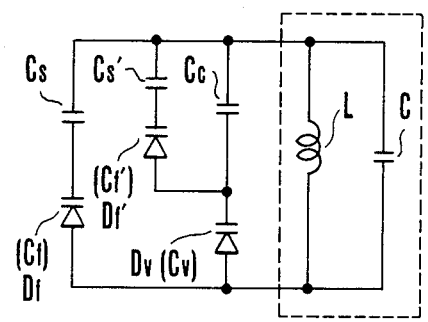
FIGS. 2(A), 2(B), and 2(C) are equivalent circuit diagrams of FIG. 1.
Figure 2B:
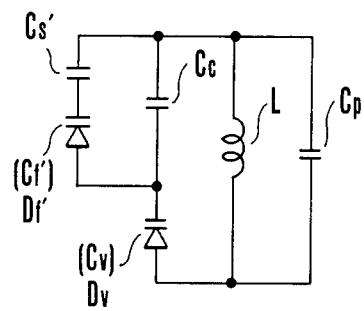
Figure 2C:
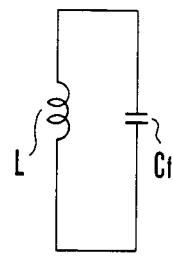

FIGS. 2(A), 2(B), and 2(C) show an equivalent circuit of FIG. 1, in which FIG. 2(A) shows all the elements concerning oscillation frequency, FIG. 2(B) shows a state in which a change in modulation sensitivity is canceled by the capacitor Cs' and the VCD·Df', and FIG. 2(C) shows a synthetic state.

In consideration of the capacitor Cs' and the VCD·Df' as shown in FIG. 2(B), if the modulation signal is supplied to only the VCD·Df', $$C_p = C + \frac{Cs \cdot Cf}{Cs + Cf}$$

is established.

Figure 9:
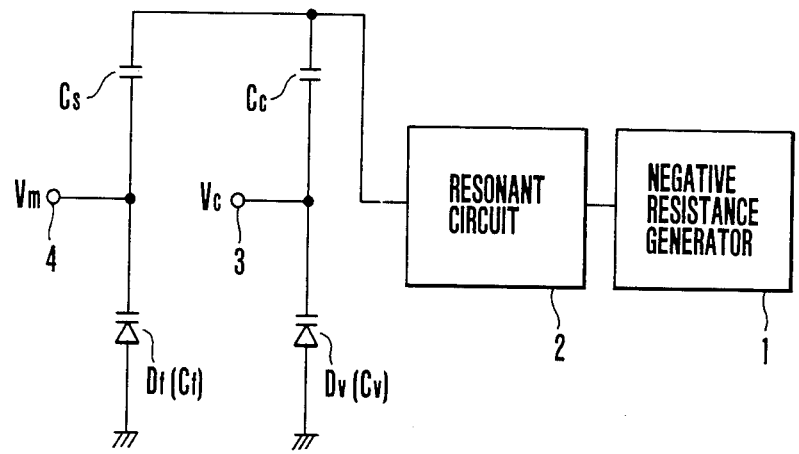
FIG. 9 is a circuit diagram of a conventional example.
Figures 10A, 10B:
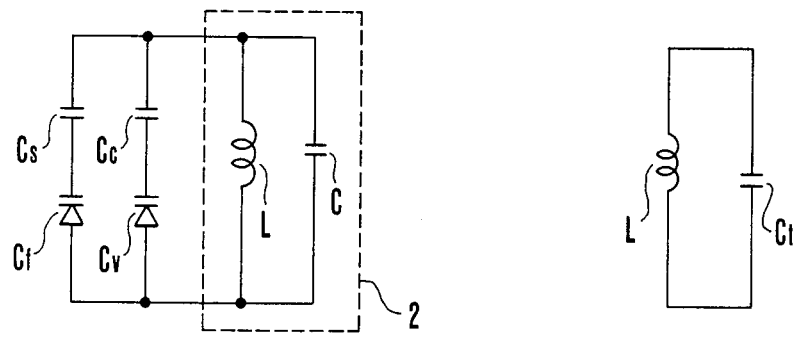
FIGS. 10(A) and 10(B) are equivalent circuit diagrams of FIG. 9.

For this reason, when the modulation sensitivity S' is obtained as in FIG. 9, it is represented as follows as equation (6):

$$S' = \frac{f_0 \cdot r}{2V_0} C_0(a' - b') \quad (11)$$

for $a' = C_v(C_p + C_c + C_{s'})C_p(C_c + C_{s'})/$
$C_v\{C_p(C_0 + C_{s'}) + C_c(C_0 + C_{s'}) + C_0 \cdot C_{s'}\} +$
$C_p\{C_c(C_0 + C_{s'}) + C_0 \cdot C_{s'}\}$ $b' = C_v + C_c + C_{s'}/C_v(C_0 + C_{s'}) +$
$C_c(C_0 + C_{s'}) + C_0 \cdot C_{s'}$ $f_0 = \frac{1}{2\pi \sqrt{L \cdot C}} [C_v \{C_p(C_0 + C_{s'}) + C_c(C_0 + C_{s'}) +$
$C_0 \cdot C_{s'}\} + C_p\{C_c(C_0 + C_{s'}) + C_0 \cdot C_{s'}\}/C_v(C_0 +$
$C_{s'}) + C_c(C_0 + C_{s'}) + C_0 \cdot C_{s'}]^{-\frac{1}{2}}$ Assuming the $\alpha$ and $\beta$ are as follows,
$\alpha = C_c(C_0 + C_{s'}) + C_0 \cdot C_{s'}$
$\beta = C_0 + C_s$
the following equation is obtained:

$$S' = \frac{r \cdot C_0}{2V_0} \cdot \frac{C_v{}^2 \cdot C_{s'}{}^2}{\{C_v(C_p \cdot \beta + \alpha) + C_p \cdot \alpha\}(C_v \cdot \beta + \alpha)} \cdot f_0 \quad (12)$$

In equation (12), assuming that only Cv changes to change the oscillation frequency while Cp is constant, the following equation is obtained:

$$f_0 = \frac{1}{2\pi \sqrt{L}} \cdot \left( \frac{C_v(C_p \cdot \beta + \alpha) + C_p \cdot \alpha}{C_v \cdot \beta + \alpha} \right)^{-\frac{1}{2}}$$

Therefore, the following equation is obtained:

$$C_v = \frac{(1 - 4\pi^2 \cdot f_0{}^2 \cdot L \cdot C_p)\alpha}{4\pi^2 \cdot f_0{}^2 \cdot L \cdot \alpha - \beta(1 - 4\pi^2 \cdot f_0{}^2 \cdot L \cdot C_p)} \quad (13)$$

A substitution of equation (12) into equation (13) yields the following equation:

$$S' = \frac{r \cdot C_0 \cdot C_{s'}{}^2}{8\pi^2 \cdot L \cdot \alpha^2 \cdot V_0} \cdot \frac{1}{f_0} \quad (14)$$

$(1 - 4\pi^2 \cdot f_0{}^2 \cdot L \cdot C_p)^2$

Assuming that only Cv changes to change the oscillation frequency while Cp is constant, it is apparent that a change in modulation sensitivity S' with respect to a change in oscillation frequency $f_0$ is reduced in inverse proportion to the oscillation $f_0$ and in proportion to the fourth power of $f_0$.

Even if Cp is increased, $$(2\pi \cdot f_0)^2 \approx \frac{1}{L \cdot C_p}$$

and therefore, $1 - 4\pi^2 \cdot f_0{}^2 \cdot L \cdot C_p > 0$ is obtained. That is, the above relationship remains the same.

Therefore, as shown in FIG. 1, when the modulation signal Vm is supplied to the VC·Df and VC·Df' at the same time, a change in modulation sensitivity S caused by the VC·Df is proportional to the third power of the oscillation frequency $f_0$ as represented by equation (8).

However, a change in modulation sensitivity S' caused by the VC·Df' is in a direction for substantially canceling the change in modulation sensitivity S caused by the VC·Df as represented by the equation (14). As a result, the change in modulation sensitivity with respect to the change in oscillation frequency $f_0$ can be substantially suppressed.

Figure 3:
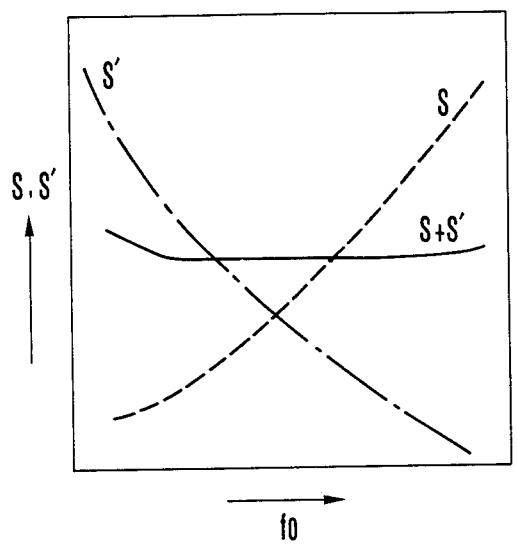
FIG. 3 is a graph showing a relationship between an oscillation frequency and modulation sensitivities.

FIG. 3 is a graph a relationship between the oscillation frequency $f_0$ and the modulation sensitivities S and S' for explaining the above state. In FIG. 3, a state obtained when the modulation signal Vm is supplied to only the VC·Df is represented by a dotted line, a state obtained when the modulation signal Vm is supplied to only the VC·Df' is represented by an alternate long and short dashed line, and a state obtained by synthesizing these two states is represented be a solid line. By supplying the modulation signal Vm to the VC·Df and the VC·Df' at the same time to change the oscillation frequency $f_0$, a change state of a synthetic modulation sensitivity S+S' is suppressed to be substantially zero.

The first to third series circuits and the resonant circuit 2 can be freely connected in various combinations. Modifications as equivalent circuits are shown in FIGS. 4 to 6(B).

Figure 4:
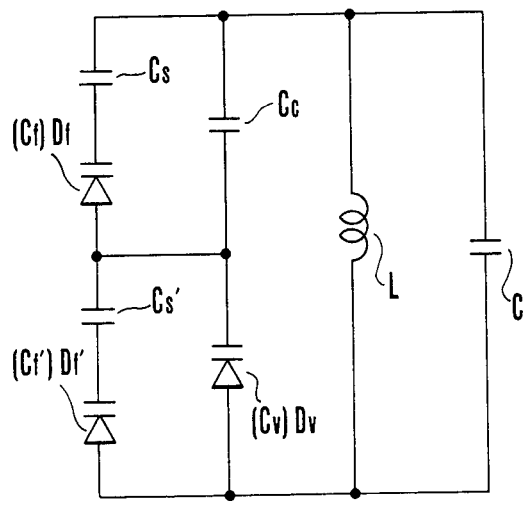
FIGS. 4 to 6(B) are equivalent circuit diagrams of modifications of the VCO in FIG. 1.

In FIG. 4, a parallel resonant circuit is used as in FIGS. 2(A) to 2(C), and a first series circuit is connected in parallel with the resonant circuit. A second series circuit is connected in parallel with a capacitor Cc, and a third series circuit is connected in parallel with a VC·Dv.

Figure 5A:
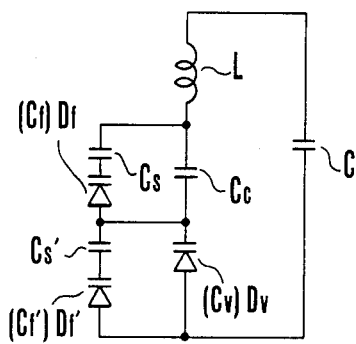
Figure 5B:
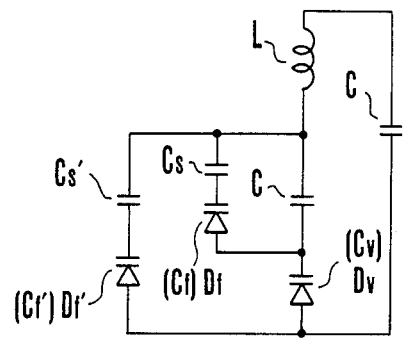

In FIGS. 5(A) to 5(D), a series resonant circuit is used, and a first series circuit is connected in series with an inductance L. In FIG. 5(A), a second series circuit is connected in parallel with a capacitor Cc, and a third series circuit is connected in parallel with a VC·Dv. In FIG. 5(B), a second series circuit is connected in parallel with a capacitor Cc, and a third series circuit is connected in parallel with the first series circuit.

Figure 5C:
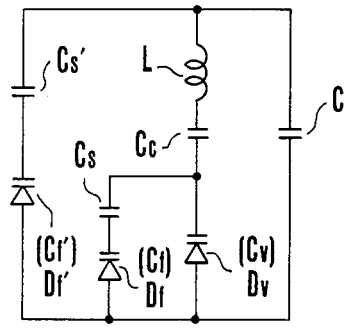
Figure 5D:
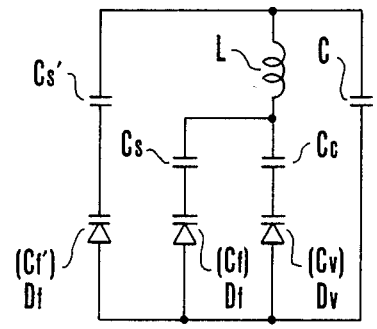

In FIGS. 5(C) and 5(D), a third series circuit is connected in parallel with an inductance L and a first series circuit. In FIG. 5(C), a second series circuit is connected in parallel with a VC·Dv. In FIG. 5(D), a second series circuit is connected in parallel with a first series circuit.

Figure 6A:
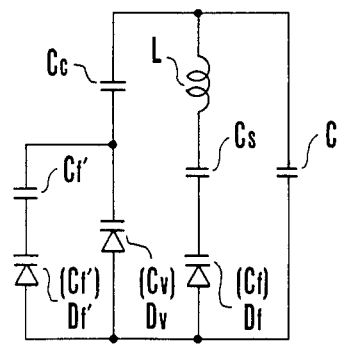
Figure 6B:
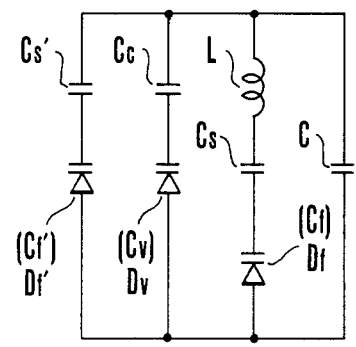

In FIGS. 6(A) and 6(B), a series circuit is used as in FIGS. 5(A) to 5(C), a second series circuit is connected in series with an inductance L, and a first series circuit is connected in parallel with the inductance L and the second series circuit. In FIG. 6(A), a third series circuit is connected in parallel with a VC·Dv. In FIG. 6(B), a third series circuit is connected in parallel with the inductance L and the first series circuit.

In either case, the modulation signal Vm must be simultaneously supplied to the VC·Df and VC·Df' while applying the control voltage Vc to the VC·Dv. In accordance with a connection state, one or both of a DC blocking capacitor and a high-frequency choke coil are inserted into a desired portion, thereby obtaining an arrangement similar to that shown in FIG. 1.

Figure 7:
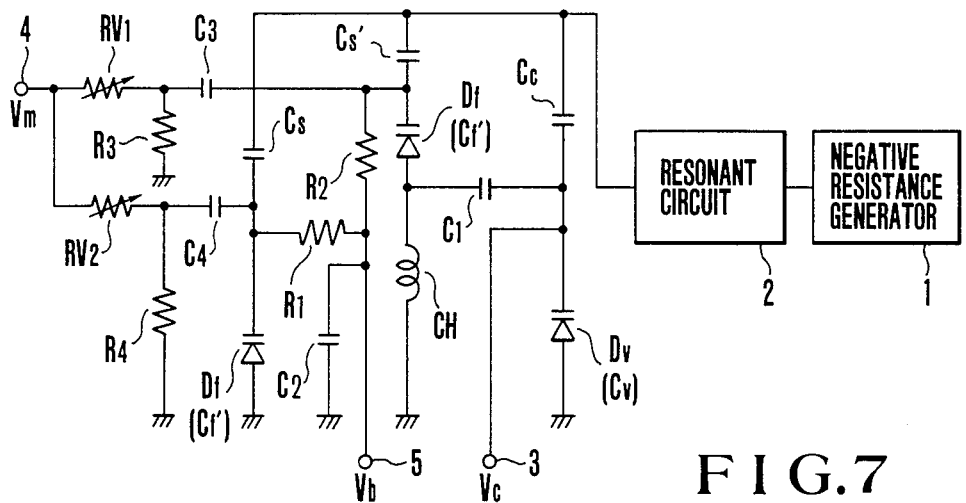
FIG. 7 is a circuit diagram corresponding to a second embodiment.

FIG. 7 is a circuit diagram corresponding to a second embodiment. In addition to the elements shown in FIG. 1, a DC bias voltage Vb is applied to a VCD Df and VC·Df' from a terminal 5 connected to a high-frequency bypass capacitor C2 through a bias circuit consisting of resistors $R_1$ and $R_2$. An L-shaped variable voltage divider consisting of a variable resistor $RV_1$ and a resistor $R_3$ and that consisting of a variable resistor $RV_2$ and a resistor $R_4$ are inserted in paths for supplying the modulation signal Vm from the terminal 4 to the VC·Df and VC·Df', respectively. Voltage-divided outputs from the variable voltage dividers are applied to the VC·Df and VC·Df' through DC blocking capacitors $C_3$ and $C_4$, respectively.

For this reason, an AC component of the modulation signal Vm is supplied together with the CD bias voltage Vb to the VC·Df and VC·Df', respectively, thereby obtaining the same results as in FIG. 1. In addition, by adjusting the variable resistors $RV_1$ and $RV_2$, an application voltage of the modulation signal Vm is controlled for each of the VC·Df and VC·Df'. As a result, since an application voltage vs. capacitance change characteristics difference between the VC·Df and VC·Df' can be freely corrected, the canceling relationship shown in FIG. 3 can be optimally set.

Figure 8:
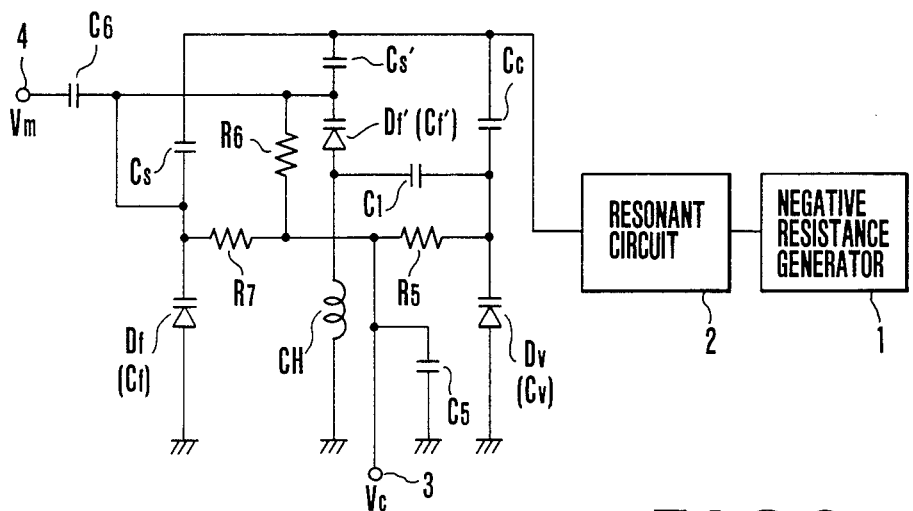
FIG. 8 is a circuit diagram corresponding to a third embodiment.

FIG. 8 is a circuit diagram corresponding to a third embodiment. In FIG. 8, a high-frequency bypass capacitor $C_5$ is connected to a terminal 3, and a control voltage Vc is applied to a VC·Dv through a resistor $R_5$ and is also applied to a VC·Df and a VC·Df' through a superposing circuit consisting of resistors $R_6$ and $R_7$. A modulation signal Vm from a terminal 4 is supplied to the VC·Df and VC·Df' through a DC blocking capacitor $C_6$ Therefore, an AC component of the modulation signal Vm and the control voltage Vc are superposed and simultaneously supplied to the VC·Df and VC·Df'.

Therefore, when application voltage vs. capacitance change characteristics of the VC·Df and VC·Df' are different from each other and hence a difference is produced between ratios of modulation sensitivity changes of the modulation signal Vm, this difference can be corrected in accordance with the control voltage Vc. As a result, the canceling relationship in FIG. 3 can be optimally maintained as in FIG. 7.

Note that in FIGS. 7 and 8, arrangements similar to those shown in FIGS. 4 to 6(B) can be arbitrarily made.

In FIGS. 1, 7, and 8, the high-frequency choke coil CH can be replaced with a resistor or vice versa, and a potentiometer can be used as a voltage divider. That is, various modifications can be made to obtain the same results.

As has been described above, according to the present invention, a change state of the modulation sensitivity with respect to a change in the oscillation frequency can be suppressed. Therefore, when a carrier wave based on the oscillation frequency is used as a transmission wave of each channel, uniform modulation sensitivity can be obtained for each channel. As a result, a significant effect can be obtained in a VCO for various applications in which FM is performed.

What is claimed is:

1. A voltage-controlled oscillator comprising:
   a negative resistance generator;
   a resonant circuit excited by said negative resistance generator and including an inductance;
   a first series circuit, consisting of a first capacitor and a first variable capacitance diode to which a control voltage is applied, for controlling an oscillation frequency for changing a resonant frequency of said resonant circuit;
   a second series circuit, consisting of a second capacitor and a second variable capacitance diode to which a modulation signal is supplied, for modulating a frequency for changing the resonant frequency of said resonant circuit; and
   a third series circuit, consisting of a third capacitor and a third variable capacitance diode to which the modulation signal is supplied, for changing the resonant frequency of said resonant circuit in a direction for canceling a change in modulation sensitivity caused by said second series circuit.

2. An oscillator according to claim 1, wherein said resonant circuit is a parallel resonant circuit and said first series circuit is connected in parallel with said parallel resonant circuit.

3. An oscillator according to claim 1, wherein said resonant circuit is a series resonant circuit and said first series circuit is connected in series with an inductance of said series resonant circuit.

4. An oscillator according to claim 1, wherein said resonant circuit is a series resonant circuit, said second series circuit is connected in series with an inductance of said series resonant circuit, and said first series circuit is connected in parallel with said inductance and said second series circuit.

5. An oscillator according to claim 2, wherein said second series circuit is connected in parallel with said parallel resonant circuit and said third series circuit is connected in parallel with said first capacitor of said first series circuit.

6. An oscillator according to claim 2 or 3, wherein said second series circuit is connected in parallel with said first capacitor of said first series circuit and said third series circuit is connected in parallel with said first variable capacitance diode of said first series circuit.

7. An oscillator according to claim 3, wherein said second series circuit is connected in parallel with said first capacitor of said first series circuit and said third series circuit is connected in parallel with said first series circuit 8. An oscillator according to claim 3, wherein said second series circuit is connected in parallel with said first variable capacitance diode of said first series circuit and said third series circuit is connected in parallel with said inductance of said series resonant circuit and said first series circuit.

9. An oscillator according to claim 3, wherein said second series circuit is connected in parallel with said first series circuit and said third series circuit is connected in parallel with said inductance of said series resonant circuit and said first series circuit.

10. An oscillator according to claim 4, wherein said third series circuit is connected in parallel with said first variable diode of said first series circuit.

11. An oscillator according to claim 4, wherein said third series circuit is connected in parallel with said inductance of said series resonant circuit and said second series circuit.

12. A voltage-controlled oscillator comprising:
    a negative resistance generator;
    a resonant circuit excited by said negative resistance generator and including an inductance;
    a first series circuit, consisting of a first capacitor and a first variable capacitance diode to which a control voltage is applied, for controlling an oscillation frequency for changing a resonant frequency of said resonant circuit;
    a second series circuit, consisting of a second capacitor and a second variable capacitance diode to which a modulation signal is supplied, for modulating a frequency for changing the resonant frequency of said resonant circuit;

a third series circuit, consisting of a third capacitor and a third variable capacitance diode to which the modulation signal is supplied, for changing the resonant frequency of said resonant circuit in a direction for canceling a change in modulation sensitivity caused by said second series circuit;

a bias circuit for applying a DC bias voltage to said second and third variable diodes; and variable voltage dividers each inserted in a corresponding one of paths for supplying modulation signals to said second and third variable capacitance diodes.

13. An oscillator according to claim 12, wherein said resonant circuit is a parallel resonant circuit and said first series circuit is connected in parallel with said parallel resonant circuit.

14. An oscillator according to claim 12, wherein said resonant circuit is a series resonant circuit and said first series circuit is connected in series with an inductance of said series resonant circuit.

15. An oscillator according to claim 12, wherein said resonant circuit is a series resonant circuit, said second series circuit is connected in series with an inductance of said series resonant circuit, and said first series circuit is connected in parallel with said inductance and said second series circuit.

16. An oscillator according to claim 13, wherein said second series circuit is connected in parallel with said parallel resonant circuit and said third series circuit is connected in parallel with said first capacitor of said first series circuit.

17. An oscillator according to claim 13 or 14, wherein said second series circuit is connected in parallel with said first capacitor of said first series circuit and said third series circuit is connected in parallel with said first variable capacitance diode of said first series circuit.

18. An oscillator according to claim 14, wherein said second series circuit is connected in parallel with said first capacitor of said first series circuit and said third series circuit is connected in parallel with said first series circuit.

19. An oscillator according to claim 14, wherein said second series circuit is connected in parallel with said first variable capacitance diode of said first series circuit and said third series circuit is connected in parallel with said inductance of said series resonant circuit and said first series circuit.

20. An oscillator according to claim 14, wherein said second series circuit is connected in parallel with said first series circuit and said third series circuit is connected in parallel with said inductance of said series resonant circuit and said first series circuit.

21. An oscillator according to claim 15, wherein said third series circuit is connected in parallel with said first variable diode of said first series circuit.

22. An oscillator according to claim 15, wherein said third series circuit is connected in parallel with said inductance of said series resonant circuit and said second series circuit.

23. A voltage-controlled oscillator comprising:
a negative resistance generator;
a resonant circuit excited by said negative resistance generator and including an inductance;
a first series circuit, consisting of a first capacitor and a first variable capacitance diode to which a control voltage is applied, for controlling an oscillation frequency for changing a resonant frequency of said resonant circuit;

a second series circuit, consisting of a second capacitor and a second variable capacitance diode to which a modulation signal is supplied, for modulating a frequency for changing the resonant frequency of said resonant circuit;

a third series circuit, consisting of a third capacitor and a third variable capacitance diode to which the modulation signal is supplied, for changing the resonant frequency of said resonant circuit in a direction for canceling a change in modulation sensitivity caused by said second series circuit; and a superposing circuit for superposing and supplying the modulation signal and the control voltage to said second and third variable capacitance diodes.

24. An oscillator according to claim 23, wherein said resonant circuit is a parallel resonant circuit and said first series circuit is connected in parallel with said parallel resonant circuit.

25. An oscillator according to claim 23, wherein said resonant circuit is a series circuit and said first series circuit is connected in series with an inductance of said series resonant circuit.

26. An oscillator according to claim 23, wherein said resonant circuit is a series resonant circuit, said second series circuit is connected in series with an inductance of said series resonant circuit, and said first series circuit is connected in parallel with said inductance and said second series circuit.

27. An oscillator according to claim 24, wherein said second series circuit is connected in parallel with said parallel resonant circuit and said third series circuit is connected in parallel with said first capacitor of said first series circuit.

28. An oscillator according to claim 24 or 25, wherein said second series circuit is connected in parallel with said first capacitor of said first series circuit and said third series circuit is connected in parallel with said first variable capacitance diode of said first series circuit.

29. An oscillator according to claim 25, wherein said second series circuit is connected in parallel with said first capacitor of said first series circuit and said third series circuit is connected in parallel with said first series circuit.

30. An oscillator according to claim 25, wherein said second series circuit is connected in parallel with said first variable capacitance diode of said first series circuit and said third series circuit is connected in parallel with said inductance of said series resonant circuit and said first series circuit.

31. An oscillator according to claim 25, wherein said second series circuit is connected in parallel with said first series circuit and said third series circuit is connected in parallel with said inductance of said series resonant circuit and said first series circuit.

32. An oscillator according to claim 26, wherein said third series circuit is connected in parallel with said first variable diode of said first series circuit.

33. An oscillator according to claim 26, wherein said third series circuit is connected in parallel with said inductance of said series resonant circuit and said second series circuit.

* * * * *